United States Patent [19]

Schinabeck

[11] Patent Number: 4,637,020
[45] Date of Patent: Jan. 13, 1987

[54] METHOD AND APPARATUS FOR MONITORING AUTOMATED TESTING OF ELECTRONIC CIRCUITS

[75] Inventor: John Schinabeck, Pleasanton, Calif.

[73] Assignee: Fairchild Semiconductor Corporation, Cupertino, Calif.

[21] Appl. No.: 611,449

[22] Filed: May 17, 1984

Related U.S. Application Data

[63] Continuation-in-part of Ser. No. 518,499, Aug. 1, 1983, abandoned.

[51] Int. Cl.$^4$ ............................................. G01R 31/28
[52] U.S. Cl. .................................. 371/20; 324/73 R; 364/579; 371/25
[58] Field of Search ............................ 371/20, 25, 27; 324/73 R, 73 AT, 73 PC; 364/579, 580

[56] References Cited

U.S. PATENT DOCUMENTS

| | | | |
|---|---|---|---|
| 3,657,527 | 4/1972 | Kassabgi et al. | 371/25 |
| 4,044,244 | 8/1977 | Foreman et al. | 371/20 |
| 4,055,801 | 10/1977 | Pike et al. | 324/73 R |
| 4,070,565 | 1/1978 | Borrelli | 371/20 |
| 4,168,527 | 9/1979 | Winkler | 364/580 |
| 4,271,515 | 6/1981 | Axtell, III et al. | 371/25 |
| 4,439,858 | 3/1984 | Peterson | 371/20 |
| 4,517,512 | 5/1985 | Petrich et al. | 324/73 R |
| 4,523,312 | 6/1985 | Takeuchi | 371/25 X |

Primary Examiner—Charles E. Atkinson
Attorney, Agent, or Firm—Theodore S. Park; Bruce D. Riter; Robert C. Colwell

[57] ABSTRACT

A plurality of signal applying and monitoring circuits are coupled to pins of an electronic device being tested to force test stimuli signals representing logic states or other parameters onto input pins of the device under test. The responses to the stimuli signals are monitored while the device is being tested. Each signal applying and monitoring circuit includes a node to be coupled to a pin of the device under test, a device power supply connected to the node for supplying a test bias signal, a comparison circuit connected to the node for indicating the relative magnitude of the test bias signal with respect to the bias level at the node, and a latch circuit responsive to the output signal produced by the comparison circuit. The device power supply is included for providing test bias signals to test power drain during functional testing. The transitions of the device power supply are monitored and latched for providing a record of the power drain of the device being tested. Other features are also disclosed.

11 Claims, 5 Drawing Figures

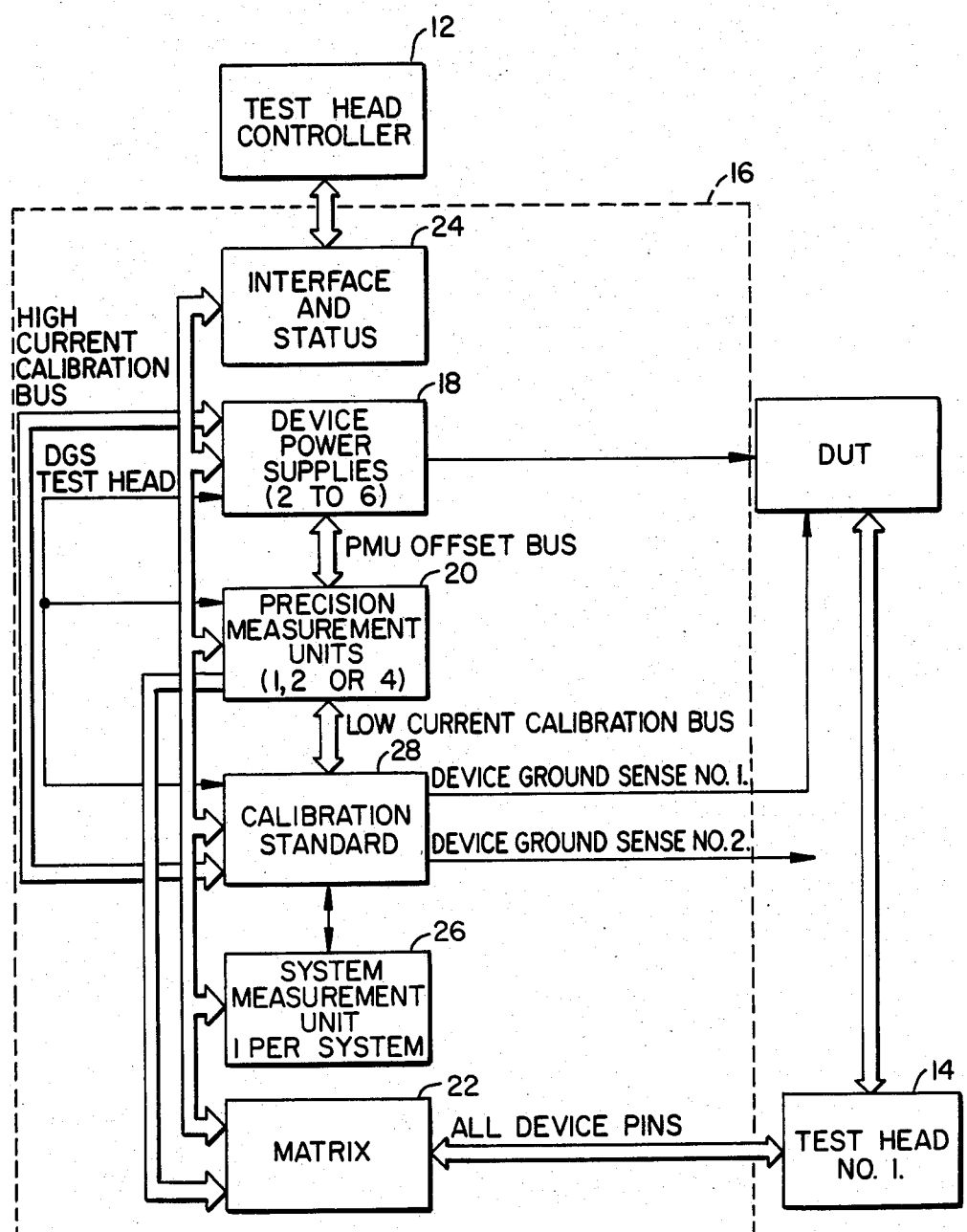
FIG._1.

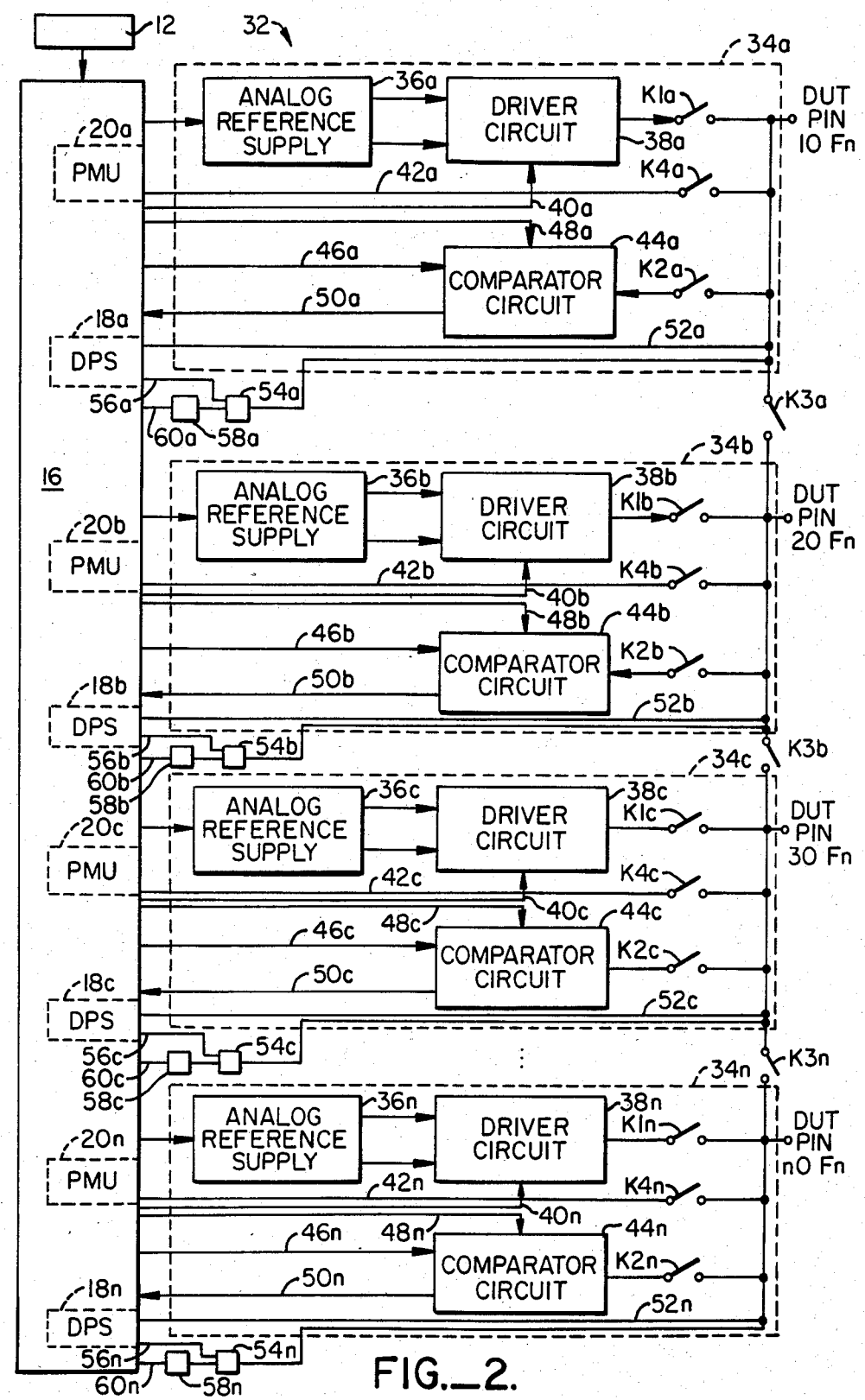
FIG._2.

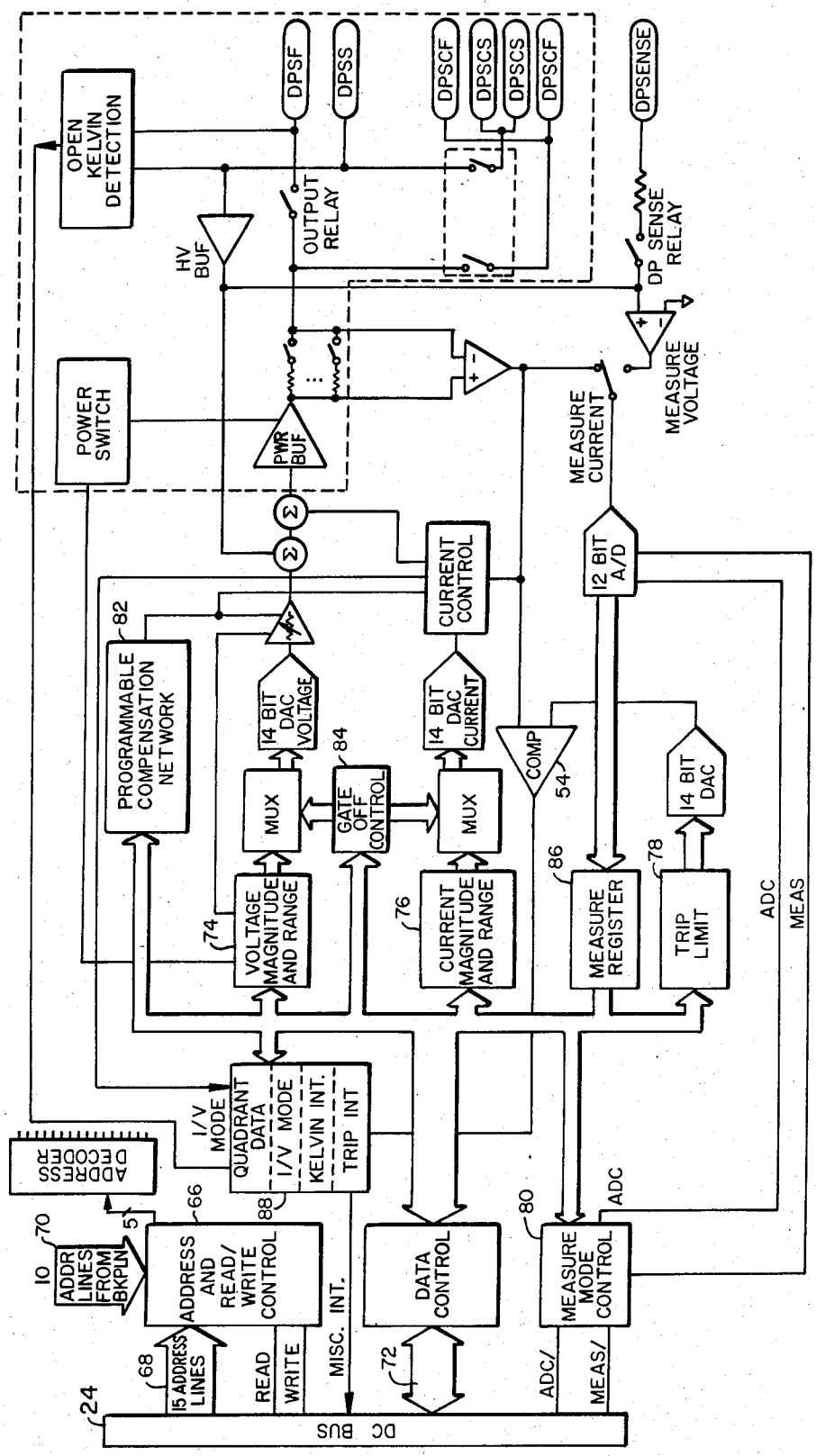
FIG._3.

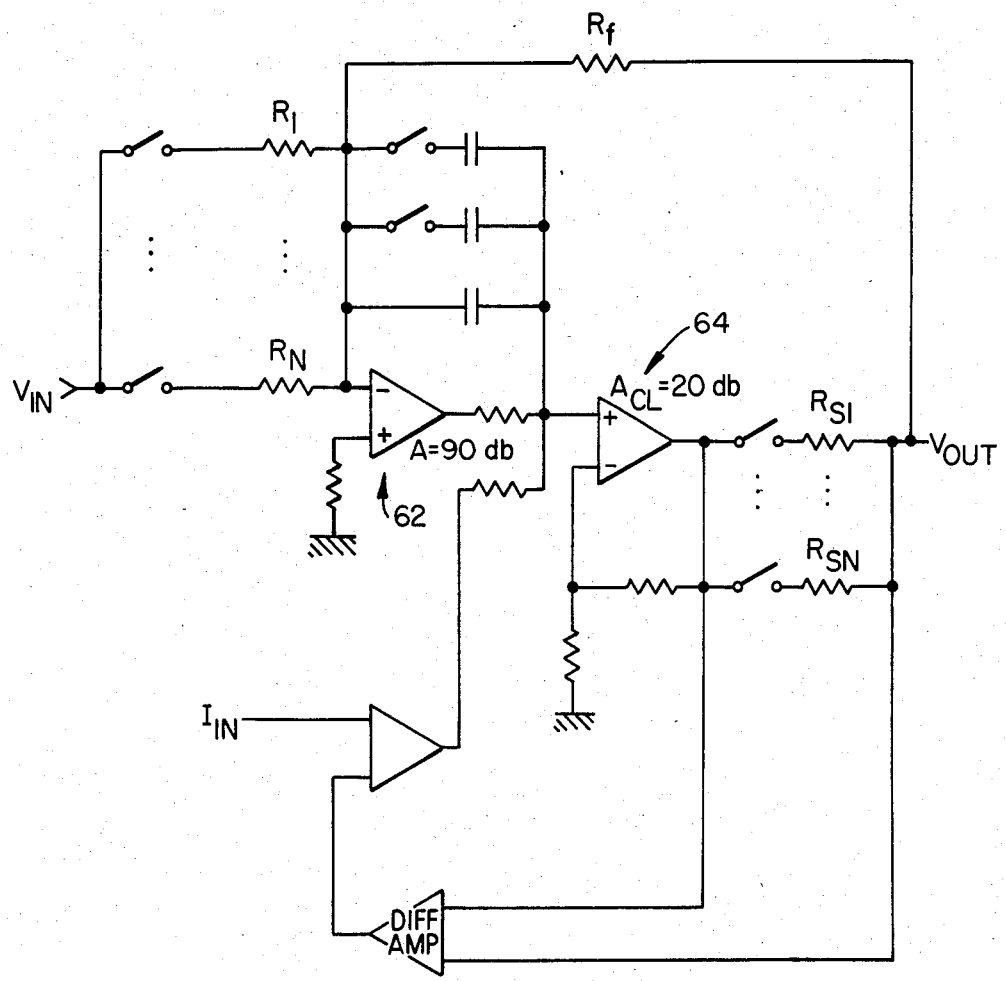
FIG._4.

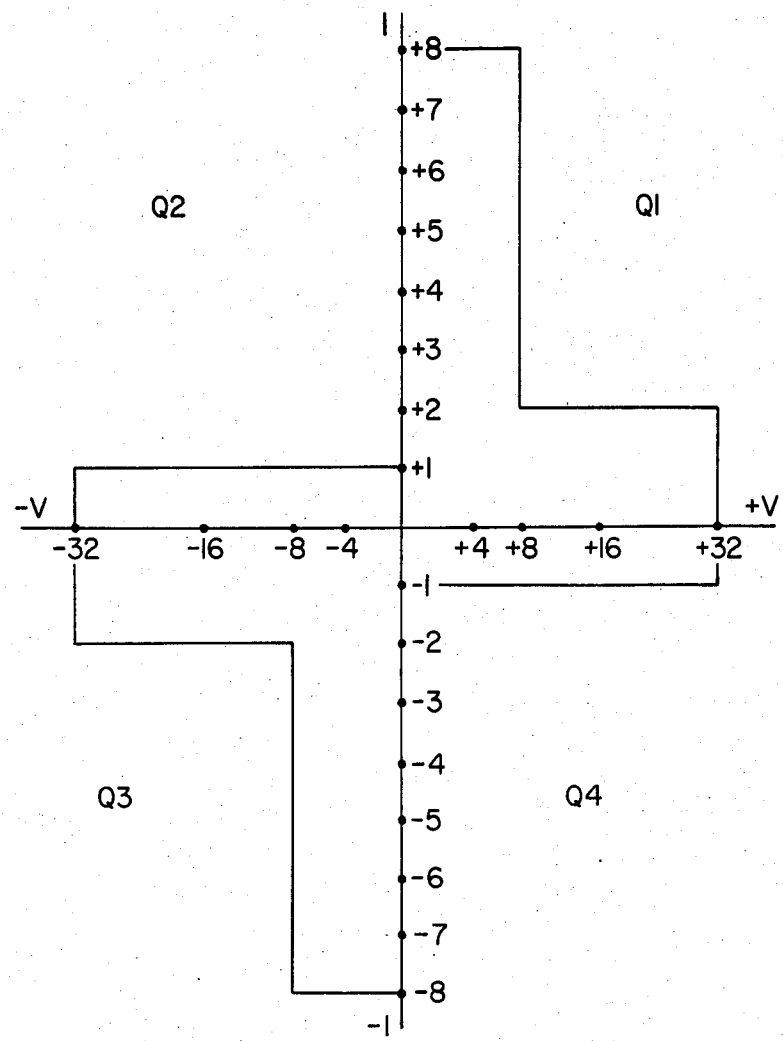
FIG._5.

METHOD AND APPARATUS FOR MONITORING AUTOMATED TESTING OF ELECTRONIC CIRCUITS

CROSS-REFERENCE TO RELATED APPLICATION

This relates to the automated electronic test equipment disclosed in, and is a continuation-in-part of, the copending patent application of Richard F. Herlein, Rodolfo F. Garcia, Robert L. Hickling, Burnell G. West, Jamal Alrawi, Jeffrey A. Davis, John G. Campbell, Ronald L. Cline, E. J. Cotriss, John R. Schinabeck, and James R. Murdock, entitled HIGH SPEED TEST SYSTEM, U.S. Ser. No. 518,499, filed on Aug. 1, 1983, and assigned to the same assignee as this application, now abandoned.

This also relates to the tester circuitry described in a copending patent application of John Schinabeck and James R. Murdock, entitled METHOD AND APPARATUS FOR APPLYING AND MONITORING PROGRAMMED TEST SIGNALS DURING AUTOMATED TESTING OF ELECTRONIC CIRCUITS, U.S. Ser. No. 06/611,445, and a copending patent application of the same inventors, entitled METHOD AND APPARATUS FOR MONITORING RESPONSE SIGNALS DURING AUTOMATED TESTING OF ELECTRONIC CIRCUITS, U.S. Ser. No. 06/611,448, as well as copending patent applications U.S. Ser. No. 06/611,266, entitled TEMPERATURE STABILIZED GATE; U.S. Ser. No. 06/611,267, entitled TEST PERIOD GENERATOR FOR AUTOMATIC TEST EQUIPMENT; U.S. Ser. No. 06/611,646, entitled FORMATTER FOR HIGH SPEED TEST SYSTEM; U.S. Ser. No. 06/611,451, entitled METHOD AND APPARATUS FOR DYNAMICALLY CONTROLLING THE TIMING OF SIGNALS IN AUTOMATIC TEST SYSTEMS; U.S. Ser. No. 06/611,452, entitled GATE HAVING BALANCED NODE; U.S. Ser. No. 06/611,453, entitled CONTROL OF SIGNAL TIMING APPARATUS IN AUTOMATIC TEST SYSTEMS USING MINIMAL MEMORY; and U.S. Ser. No. 06/611,454, entitled MULTIPLE STAGE GATE NETWORK, all assigned to the same assignee.

BACKGROUND OF THE INVENTION

This invention relates to electronic circuits and, more particularly, to general purpose test systems capable of testing very large scale integrated (VLSI) circuits, including microprocessors, logic arrays, and multi-chip assemblies, at high speeds. Specifically, the invention is directed to a method and apparatus for automatically testing the power drain characteristics of a series of electronic circuits by continuously applying and monitoring bias signals during testing of the electronic circuits in an automated electronic test system.

In automated electronic test equipment, one or more electrical signal sources is coupled to the pins or other nodes at the inputs of an electronic device being tested to force stimuli signals controlled by a test system computer onto the device under test, and the resultant conditions at the outputs of the device being tested are monitored. Typically, the stimuli signals represent logic states or analog voltages or currents which are applied in a parallel pattern to the input pins of the device under test, and the resulting output pattern is checked in parallel.

The signal sources apply stimuli signals to the device under test through pin electronics interface circuits which function as computer controlled interface circuits between the computer of the test system and the individual pins of the device being tested. The pin electronics interface circuits receive these stimuli signals and then through input drivers included in the pin electronics interface circuits switch these stimuli signals onto the desired input pins of the device under test in accordance with a stored program in the test system. The pin electronics interface circuits also receive reference voltages or currents which comparator circuits included in the pin electronics interface circuits compare to the voltages or currents received from the output pins of the device being tested. The output signals from the comparator circuits are returned to the test system computer where they are checked in accordance with a stored program for the proper responses. In this manner, electronic components, for example, semiconductor memories or other integrated circuits, can be individually tested to assure that they meet whatever standard or specifications the ultimate user of the integrated circuit desires.

One disadvantage in the operation of such automated electronic test equipment is the emphasis on functional tests of the device being tested. Functional tests are tests to determine simply whether or not the device under test produces the proper pattern of expected responses to the pattern of logic states applied as stimuli signals. Extreme importance is attached to the functional tests as these tests are typically the basis for pass and fail of the device being tested in the automated electronic test equipment. Unfortunately, other parameters, for example, power drain, another important parameter of the device under test, are often entirely ignored. Precision measurement units included in known automated electronic test equipment typically do not provide a sufficient power source to test power drain on the device being tested. Moreover, when power drain is monitored, the functional test of the device being tested is interrupted, the power drain is measured at the time of interruption, and the device is simply indicated to have passed or failed. The power drain can, however, have been excessive during functional test at a time other than the time of interruption and not merely at the interruption or end of the test. Consequently, known automated electronic test equipment is susceptible to passing defective devices having excessive power drain characteristics. Furthermore, even if power drain is monitored, known automated electronic test equipment does not store continuously monitored operating points of the bias supply during continuous testing and employ the power drain response of a failed device under test to discover or debug the cause for the failure.

Considered in more detail, known precision measurement unit per tin tests use high speed pin electronics interface circuits at static test rates. To set a specified current force condition of test, the programmable load (source or sink current) is applied while voltage comparators sense the limit of test. This current force/voltage measure type of test simulates typical high speed pin electronics interface circuit function at static rather than higher functional test rates allowing accuracy to the minimum resolution step of the voltage and current levels used. When the measurement parameter is a current with a voltage condition of test to be forced, the programmable load current is again used as the test forcing function. In this case, the forced current develops a load dependent voltage at the device under test, and voltage comparators are used to sense if this voltage is above or below the intended condition of test for a pass/fail decision. This procedure assures measurement accuracies to the minimum resolution step, where similar application of the same circuitry at high speed functional test rates results in waveform aberrations that reduce the measurement resolution possible.

As circuits increase in density and gate count, however, they become more of a power sink or load source, and bias currents much greater than one ampere are often present. Consequently, settling times are longer. Use of a precision measurement unit at static test rates often is unacceptable because of long settling times not experienced heretofore. Power drain tests with a precision measurement unit are therefore impractical. The power drain of the device being tested at functional test speed is, however, an important application parameter, as well as a quality indicator normally treated lightly in traditional automated electronic test equipment and in most manufacturers' device specifications.

SUMMARY OF THE INVENTION

The present invention provides a method and apparatus for continuously applying static analog bias voltages or currents and continuously monitoring the bias supply as the device is being tested to ascertain the power demand at different operating points so as to evaluate the operating characteristics of the device under test vis-a-vis the specifications for the device being tested. Thus, power drain and other similar electrical properties can be tested. The invention provides asynchronous power drain limit indication which is versatile and fast enough to sense all significant power drain tolerance conditions. Asynchronous fail indicators provided in accordance with the invention add to the rigor of a functional test by detecting abnormal power drain conditions that do not necessarily cause a functional fail. If the power drain parameter is continuously monitored and a problem is present, a slow precision measurement unit per pin type test can pinpoint the step in the functional test where the problem appears or occurs, which provides a powerful debugging tool.

The present invention provides a method and apparatus for tracing the history and direction of a load demand change. The method and apparatus in accordance with the invention monitor, for example, whether or not the bias supply operated on a predetermined voltage or current rail; whether or not the bias supply operated in one or more quadrants, that is, the positive-voltage-positive-current quadrant, the positive-voltage-negative-current quadrant, the negative-voltage-negative-current quadrant, or the negative-voltage-positive-current quadrant; whether or not the bias supply equaled or exceeded a given current limit; and whether or not a Kelvin open occurred.

According to this invention, a method and apparatus are provided for automatically applying and monitoring forcing functions to a device being tested. The invention provides a method for continuously applying and monitoring a test bias signal at a node of a device under test including digitally programmed source means having a preselected programmed voltage-current characteristic defined by not-to-exceed voltage rail and current rail levels for supplying a test bias signal to the node, comparison means connected to the node, and means for latching the output signal produced by the comparison means, the method comprising the steps of: connecting the test bias signal to the node; continuously comparing the voltage applied to the node with the preselected programmed voltage rail level; providing an indication of the relative magnitude of the voltage applied to the node with respect to the voltage rail level; setting first latching means when the voltage applied to the node reaches the voltage rail level; continuously comparing the current at the node with the preselected programmed current rail level; providing an indication of the relative magnitude of the current at the node with respect to the current rail level; and setting second latching means when the current at the node reaches the current rail level.

Preferably the method further comprises the steps of: continuously comparing the test bias signal voltage applied to the node with a reference voltage for determining the polarity of the test bias signal voltage; continuously comparing the test bias signal current at the node with a reference current for determining the polarity of the test bias signal current; setting third latching means when the test bias signal voltage applied to the node is positive and the test bias signal current at the node is positive; setting fourth latching means when the test bias signal voltage applied to the node is positive and the test bias signal current at the node is negative; setting fifth latching means when the test bias signal voltage applied to the node is negative and the test bias signal current at the node is negative; and setting sixth latching means when the test bias signal voltage applied to the node is negative and the test bias signal current at the node is positive.

Furthermore, the method additionally comprises the steps of: continuously comparing the test bias signal with the bias level at the node; providing an indication of the relative magnitude of the test bias signal with respect to the bias level; and setting another latching means when the test bias signal has a predetermined relationship with respect to the bias level. The method also preferably comprises the steps of: continuously comparing the bias level voltage at the node with a Kelvin reference voltage; providing an indication of the relative magnitude of the bias level voltage at the node with respect to the Kelvin reference voltage; and setting an additional latching means when the bias level voltage at the node has a predetermined relationship with respect to the Kelvin reference voltage. Preferably, the test bias signal is a forcing function which starts at zero volts and one percent of the maximum current of a preselected voltage-current range.

In accordance with another aspect of the invention, an embodiment of apparatus for continuously applying and monitoring a test bias signal to a node of a device under test is provided, comprising: digitally programmed source means connected to the node, the digitally programmed source means having a preselected programmed voltage-current characteristic defined by not-to-exceed voltage rail and current rail levels for supplying test bias signals to the node; first comparison means connected to the node for continuously comparing the voltage applied to the node with the preselected programmed voltage rail level; first latching means for providing an indication when the voltage applied to the node reaches the voltage rail level; second comparison means connected to the node for continuously comparing the current at the node with the preselected programmed current rail level; and second latching means for providing an indication when the current at the node reaches the current rail level.

Preferably, the apparatus further comprises: third comparison means for continuously comparing the test bias signal voltage applied to the node with a reference voltage for determining the polarity of the test bias signal voltage; fourth comparison means for continuously comparing the test bias signal current at the node with a reference current for determining the polarity of the test bias signal current; third latching means for providing an indication when the test bias signal voltage applied to the node is positive and the test bias signal current at the node is negative; fourth latching means for providing an indication when the test bias signal voltage applied to the node is positive and the test bias signal current at the node is negative; fifth latching means for providing an indication when the test bias signal voltage applied to the node is negative and the test bias signal current at the node is negative; and sixth latching means for providing an indication when the test bias signal voltage applied to the node is negative and the test bias signal current at the node is positive.

Preferably, the apparatus additionally comprises: fifth comparison means connected to the node for continuously indicating the relative magnitude of the test bias signal with respect to the bias level at the node; and another latching means for providing an indication when the test bias signal has a predetermined relationship with respect to the bias level. The apparatus also preferably comprises: sixth comparison means for continuously comparing the bias level voltage at the nodes with a Kelvin reference voltage; and an additional latching means for providing an indication when the bias level voltage at the node has a predetermined relationship with respect to the Kelvin reference voltage. Preferably, the digitally programmed source means is a crossover source which supplies a test bias signal in the form of a forcing function that starts at zero volts and one percent of the maximum current of a preselected voltage-current range.

Four-quadrant, automatic crossover digitally programmed sources are included in a device power supply with an on-board analog-to-digital converter for comparative results of the digitally programmed source operating point and power demand of the device being tested. Digitally programmed source status indicators defining the operating quadrant and rail, as well as an analog current or voltage compare result, sense test fail conditions. Thus, when a device under test is biased by multiple digitally programmed sources (i.e., VCC, VDD, VBB, and VSS) and subjected to a high speed functional test or truth table exercise, an out of tolerance bias current fail can be detected. Digitally programmed source status indicators are latched to provide a history of how the digitally programmed source arrived at the final operating point. Then after analog settling, status indicators that are to participate in a subsequent asynchronous or immediate power up fail test are momentarily reset as their interrupt path is enabled. An analog-to-digital result holding register combined with dual limit registers and digital comparison provides a fast and powerful test monitoring tool. The method and apparatus in accordance with the invention facilitate engineering characterization, production testing, incoming inspection, and quality assurance of complex integrated circuits, such as VLSI circuits.

The method and apparatus in accordance with the invention also provide a helpful debugging tool. Verification of otherwise hidden internal node shorts or opens in the device under test can be attained at a later time by slowing the functional test execution rate to discover the cause.

BRIEF DESCRIPTION OF THE DRAWINGS

The above and other features of the invention and the concomitant advantages will be better understood and appreciated by those skilled in the art in view of the description of the preferred embodiments given below in conjunction with the accompanying drawings. In the drawings:

FIG. 1 is a block diagram of a test system fabricated according to the invention;

FIG. 2 is a more detailed block diagram of the testing circuit of this invention;

FIG. 3 is a schematic circuit diagram of the device power supplies included in the testing circuit shown in FIG. 2;

FIG. 4 is a detailed schematic circuit diagram of the analog circuitry included in the digitally programmed sources of the device power supplies included in the testing circuit shown in FIG. 2; and FIG. 5 illustrates the current-voltage characteristics of the digitally programmed sources of the device power supplies included in the testing circuit shown in FIG. 2.

DESCRIPTION OF THE PREFERRED EMBODIMENTS

FIG. 1 is a block diagram of a test system fabricated according to this invention. Shown in FIG. 1 is a test head controller 12. The test head controller 12 is preferably implemented with a dedicated 68000 microprocessor manufactured by Motorola Inc. of Phoenix, Ariz. coupled with program and data random access memory (RAM) and 16 Kilobytes of bootstrap programmable read only memory (PROM). The test head controller 12 transmits control data and receives subsystem status reports, interrupt requests, and test data. The test head controller 12 is responsible for all communications between the test program and the testing circuit, with the exception of the down loading of test vectors which are handled by a test vector store (not shown). One test head controller 12 is provided for each test head 14.

Each test head controller 12 interfaces to a direct current (DC) subsystem 16 associated with the test head 14. One dedicated DC subsystem 16 is preferably provided for each test head 14. Output to the test head 14 is timed-formatted drive data (for inputs) and expect data and strobe timing (for outputs). Information received from the test head 14 is pass/fail data resulting from output comparisons.

The major functional components of the DC subsystem 16 can include: two to six device power supplies (DPS's) 18 used to supply static bias power to the device under test (DUT); one, two, or four precision measurement units 20 for voltage and current test stimulus and DUT static parameter measurements or limit tests; a guarded Kelvin relay matrix 22 for interconnection of the precision measurement units to the test head 14; an interface bus 24 to transfer control and status information between the DC subsystem and the dedicated test head controller 12; and a system measurement unit 26 and calibration standard circuit 28 used for automatic calibration of the test head and DC subsystem.

The DC subsystem 16 preferably includes the system measurement unit 26 and calibration standard circuit 28 for automatic test system calibration. The calibration standard circuit 28 has National Bureau of Standards traceable precision voltages and resistances that are used in conjunction with the system measurement unit 26 to automatically calibrate the test head 14 and DC subsystem 16 analog voltages. There is preferably one system measurement unit 26 and calibration standard circuit 28 in each test system, and they can be shared by as many as two DC substystems 16 if two test stations are present.

The test system is configured in a modular fashion and can be expanded on a functional basis (more DPS's 18 or precision measurement units 20) or by adding an additional test head 14. The DC subsystem 16 includes the DPS's 18 and precision measurement units 20 for DC parametric tests. Each DC subsystem 16 can be configured with a varying number of DPS's 18 and precision measurement units 20 to suit the individual DUT testing needs.

The DC subsystem 16 preferably includes a minimum of two DPS's 18. Additional DPS's 18 can be added, in increments of two, for a maximum of six DPS's per DC subsystem 16. The DPS's 18 provide high current (eight ampere) capability and swings of up to 32 volts (V) to supply the current requirements of the largest bipolar gate arrays.

One precision measurement unit 20 is included in the DC subsystem 16, and additional precision measurement units can be added to a maximum of four. Simultaneous use of four PMU's 20 results in increased speed for faster DC parametric tests. The precision measurement units 20, in contrast to the DPS's 18, provide high voltage and high current (100 V/256 milliamperes) at high accuracy and can be connected to all pins of the DUT. Each precision measurement unit 20 can make measurement relative to device ground, or relative to any of the DPS's 18 for such tests as $V_{OH}$.

The precision measurement units 20 are connected by the relay matrix 22 to the test head 14 via a plurality of pin electronics interface circuits included in the test head to the DUT as will be described in conjunction with FIG. 2. The precision measurement units 20 shown in FIG. 1 provide precision DC parameter tests over a greater range of current and voltage than is provided by per pin tests via the pin electronics interface circuits. Each pin electronics interface circuit includes circuitry for four DUT pins. All four channels are identical, and all are full input/output (I/O) channels.

The test systems can support one or two test heads 14, either a 128-pin configuration or a 256-pin configuration. The test head 14 is expandable from a 64-pin base in 32-pin increments. The test head 14 comprises the pin electronics interface circuit drivers, pin electronics interface circuit comparators, programmable current load, pin electronics interface circuit relays, pin electronics interface circuit reference generators, per pin measurement circuitry, and DUT interface hardware and circuits. Each channel has: a two-level driver with a high impedance (off) state; four-level comparators for V high, V low, and V intermediate pairs; and a low-capacitance programmable load that is also capable of providing a 50-ohm termination for ECL device testing with a low reflection coefficient.

The drivers, comparators, and programmable loads have dedicated digital-to-analog converters (DAC's), a total of nine DAC's per pin for complete flexibility. This flexibility provides programming ease and mixed-mode logic on multi-chip assemblies. This flexibility is a key to maintaining DC accuracy with automatic calibration compared to known automated electronic test equipment.

The relay matrix 22 is a high-quality, low-leakage relay matrix used to switch outputs from the precision measurement unit 20 to the DUT via the pin electronics interface circuits and allows force, sense, and guard lines of the precision measurement units to be connected to any pin of the DUT. The relay matrix 22 is configured to allow access to all pins in a test system with one precision measurement unit 20. In a test system with two precision measurement units 20, all odd pins are preferably connected to precision measurement unit 1, and all even pins are preferably connected to precision measurement unit 2. In a test system with four precision measurement units 20, the pins are connected to the precision measurement units in a modulo-four manner, i.e., precision measurement unit 0 to pins 0, 4, 8 . . . , precision measurement unit 1 to pins 1, 5, 9 . . . , precision measurement unit 2 to pins 2, 6, 10 . . . , and precision measurement unit 3 to pins 3, 7, 11 . . . . The relay matrix 22, however, can be reconfigured so that any precision measurement unit 20 can be assigned as 0 or 1, to allow reassignment and continued testing if one precision measurement unit fails. The DPS 18 high-sense lines and device ground sense are also relay switched to the precision measurement unit 20 low-sense lines for precision measurement unit offsetting and effective differential measurements. The interface bus 24 is the communication circuit between the DC subsystem 16 and test head controller 12 over which the DC subsystem receives information from and sends information to the test head controller.

The test system uses dedicated DC subsystem 16 circuitry for each test head 14. Thus, while DC tests are being executed at one test station, either functional or DC testing can occur simultaneously at the optional second test station. These tests are independently controlled by the dedicated test head controller 12.

On the one hand, the test head controller 12 and the precision measurement units 20 allow DC parameter tests. The test head controller 12 and precision measurement units 20 include the capability for each active test pin, under the control of programmed instructions, to be assigned as an input driver, output comparator, or I/O pin. The precision measurement units 20 shown in the testing circuit of FIG. 2 are described more fully in the copending patent application of John Schinabeck and James R. Murdock, entitled METHOD AND APPARATUS FOR APPLYING AND MONITORING PROGRAMMED TEST SIGNALS DURING AUTOMATED TESTING OF ELECTRONIC CIRCUITS, U.S. Ser. No. 06/611,445, filed on the same date as this application and assigned to the same assignee, and the disclosure is hereby incorporated by reference.

On the other hand, the DPS 18, which forms a high voltage test station, allows each test pin, under the control of programmed instructions, to be assigned as a bias supply. The force and measure amplitudes handled by the DPS 18 are greater than those handled by the test head controller 12 and precision measurement units 20, but such speed considerations as rise and fall time are necessarily slower.

A timing module offers timing edge resolution, which allows the user to accurately place edges when measuring the alternating current (AC) parameters of a high speed DUT. The test rate is programmable. The uninterrupted flow of timed test vectors between the test head controller 12 and the DUT emulates combinations to which the DUT would be subjected in its intended application.

The test system shown in the block diagram of FIG. 1 is described more fully in the aforementioned patent application of Herlein et al. entitled HIGH SPEED TEST SYSTEM (U.S. Ser. No. 518,499 filed on Aug. 1, 1983), now abandoned. The disclosure of the U.S. Ser. No. 518,499 (Aug. 1, 1983) application of Herlein et al. is hereby incorporated by reference.

FIG. 2 is a more detailed block diagram of a portion of each signal applying and monitoring circuit 32 in accordance with the invention. As shown in FIG. 2, a signal applying and monitoring circuit 32a communicates with the test head controller 12 via the interface bus 24. The test head controller 12 controls the pattern of reference signals applied to the DUT by the signal applying and monitoring circuit 32a. Several registers within the test head controller 12 allow control of each pin of the DUT while testing the programmed rate.

The signal applying and monitoring circuit 32a includes a plurality of pin electronics interface circuits 34a, 34b, 34c, ... 34n connected to n pins of the DUT. Preferably, one pin electronics interface circuit 34 is connected to each terminal of the multi-terminal DUT. Each pin electronics interface circuit 34 is capable of being operated by the test head controller 12 in one of several modes depending upon whether the pin electronics interface circuit is coupled to a DUT input signal terminal, DUT output signal terminal, or other various function or supply terminals. Thus, a DUT having sixteen terminals or pins is tested in a fixture containing sixteen identical pin electronics interface circuits 34 controlled by a single test head controller 12 containing a stored program specifically written to test the particular DUT.

For example, to functionally test a signal input terminal of the DUT, the test head controller 12 closes a relay contact K1a, for example, a reed relay contact, included in the pin electronics interface circuit 34a to connect the test-stimuli section of the signal applying and monitoring circuit 32a to pin 1 of the DUT. This section of the signal applying and monitoring circuit 32a includes an analog reference supply 36a which in response to signals from the test head controller 12 generated according to a program stored in the test system computer produces two levels of DC reference signals. These two reference signals are applied to a driver circuit 38a which biases the DUT between the two reference signals to produce a pattern of pulses for functional testing in accordance with data supplied to the driver circuit on a line 40a.

The signal applying and monitoring circuit 32a is also capable of performing parametric tests on the DUT. As will be described in greater detail, the signal applying and monitoring circuit 32a in accordance with the invention is particularly directed to power drain tests on the DUT. During one case of such testing, however, the precision measurement unit 20a located within the DC subsystem 16 supplies desired voltages or currents to the appropriate pin of the DUT. In such operation, the test head controller 12 closes only relay contact K4a, for example, a reed relay contact, to enable coupling of pin 1 of the DUT to the precision measurement unit 20a via a line 42a. Similar precision measurement units 20b, 20c, ... 20n can apply controlled signals to corresponding other pins of the DUT, or one or more precision measurement units can be multiplexed to the pins.

For quantitative voltage or current measurement, each precision measurement unit 20 can be used to apply (force) a precision program specified voltage or current to any desired pin or the DUT. Each precision measurement unit 20 preferably provides force and measurement ranges up to +100 volts (V) and 256 milliamperes (mA).

The test head controller 12 can close a relay contact K2a, for example, a reed relay contact, so that the signal from the precision measurement unit 20a coupled to the signal input terminal of the DUT is applied directly to a comparator 44a. The comparator 44a can also receive a predicted signal from the test head controller 12 via a line 46a. Consequently, the output signals from the comparator 44a can change in accordance with the signal applied to the DUT.

In addition, a data input signal can be transmitted by the test head controller 12 to the comparator 44a through a line 48a to switch the output signals from the comparator. The output signal from the comparator 44a is returned to the test head controller 12 via a line 50a. The output signal from the comparator 44a on the line 50a can cause the test head controller 12 to register either acceptance or rejection of the DUT, or to specify its quality.

The signal applying and monitoring circuit 32a is also capable of performing power drain tests on the DUT. During such testing, the DPS 18a located within the DC subsystem 16 supplies desired voltages or currents to the appropriate pin of the DUT. In such operation, pin 1 of the DUT is connected to the DPS 18a via a line 52a. Similar DPS's 18b, 18c, ... 18n can apply controlled bias signals to corresponding other pins of the DUT.

Printed circuits load board paths bring the force and sense lines of the DPS's 18 to a convenient location in the pin field area. The Kelvin closure for each DPS 18 can be made on the load board or on the DUT probe card in close proximity to the DUT.

The bias level at the signal input terminal of the DUT is also applied to a comparison means 54a. The comparison means 54a included in the DPS 18a preferably includes on-board analog-to-digital converters (ADC's) for simultaneous conversions of the voltage and current operating point. The comparison means 54a also receives a compare signal via a line 56a representative of the nominal test bias signal applied to the signal input terminal of the DUT by the DPS 18a. Consequently, the output signals from the comparison means 54a can change in accordance with the bias level (that is, the power drain) at the signal input terminal of the DUT.

In addition, the output signal from the comparison means 54a is connected to a latch circuit 58a for setting the latch circuit when the bias level at the signal input terminal of the DUT equals or exceeds the nominal test bias signal applied to the signal input terminal of the DUT. The output signal from the latch circuit 58a is returned to the test head controller 12 via a line 60a. The output signal from the latch circuit 58a on the line 60a can cause the test head controller 12 to register either acceptance or rejection of the DUT, or can be logged for providing a record of operation of the DUT in response to the test bias signal applied to the signal input terminal of the DUT by the DPS 18a.

Each DPS 18 provides a gated forcing function. The analog circuitry starts at the DAC outputs. The circuit is a precision voltage amplifier with high current capability. However, the amplifier effectively switches to a precision current source whenever the load current exceeds a programmed limit. A block diagram of the amplifier is shown in FIG. 4. The operation will be discussed in two phases: (a) operation as a voltage amplifier; and (b) operation in current clamp.

The voltage amplifier 62 is a feedback amplifier whose gain is primarily dependent on external components. The closed loop gain of this amplifier, V out/V in, is equal to Rf/Rn (Rn is one of the input resistors which is switched in to set the voltage range). The DC open loop gain is high enough (greater than 100 dB) to assure the accuracy of the closed loop gain. The first stage of the amplifier is a ua 356. This stage is connected as an integrator to provide a dominant pole for the loop. The capacitor from output to input sets the loop bandwidth and thereby the settling time for the amplifier. Two additional capacitors can be switched in to maintain stable operation when capacitive loading is heavy.

The second stage is a discrete amplifier 64 with ±8 ampere (A) drive capability. The gain of this stage is also controlled by feedback resistors and is set at 20 dB.

As long as load current does not exceed the programmed limit, the current clamp does not affect circuit operation. Load current is constantly being monitored via a current sense resistor, Rsn, at the output of the voltage amplifier. Whenever the current through Rsn exceeds the programmed value, the first stage of the voltage amplifier is forced into cutoff, and a current driver integrator takes control of the closed loop operation.

Supplying the full voltage and current range from a single DC power supply voltage is very inefficient. If one supply is used, then the supply must be 48 V since 32 V of controlled output is required. Yet this supply must supply 8 A when only 8 V of output is needed; therefore 320 watts (40×8) must be dissipated in the output buffer. If two supplies are used so that 18 V supplies power to the 8 V and lower voltage ranges and +48 V supplies power to the 16 V and 32 V ranges, considerably less power is dissipated by the DPS 18 buffer, and much smaller heat sinks are required. A power relay is used to do this switching when voltage range is selected.

As shown in FIG. 3, the address circuitry 66 takes the DC bus address inputs 68 and the backplane hardwiring 70 and connects the data lines 72 to the appropriate registers. The registers that are included are: voltage range and voltage magnitude 74; current range and current magnitude 76; relay control for relays; trip limit 78; mode control 80; A/D magnitude 86; compensation 82; and gate 84.

Most of these are self explanatory; however, there are a few features that merit further explanation. The mode control 80 provides two fields not previously available in a DPS. These are I/V mode and quadrant of operation.

The I/V mode bit 88 indicates whether the DPS 18 is in the constant voltage mode or the constant current mode. The I/V mode indicates that operation is either voltage source or current clamp.

The quadrant of operation indicates what voltage-current quadrants the DPS 18 has operated in since the register was reset. The quadrant field shows which of the four possible I/V polarities exist in the circuit or have existed in the circuit.

Status bits are stored as a history. Even momentary entry is stored.

Additionally, trip limit makes an analog comparison to determine if current is above or below a programmed value, but does not clamp output current to that value. Also, Kelvin check provided by the relay control forces an interrupt to show that the Kelvin check is operational.

The DPS 18 includes on-board comparison means 54 in the form of an analog comparator for indication of the current operating point. Since the DUT can present a power sink or source load to a connected DPS 18, four-quadrant operation is preferably provided.

With this configuration, an accurate indication of the DPS current operating point is attained by first parallel loading a DAC register with a trip limit value. As the current at the pin of the DUT crosses the preset compare level, the contents of the latch circuit 58 are latched. Thus, power drain can be continuously monitored.

The DPS 18 forcing functions are programmed with both voltage and current values. To limit the power dissipation of an out of tolerance DUT, an implied current rail, equal and opposite to the one programmed, is automatically set by the circuitry. The operating characteristic shown in FIG. 5 indicates a positive current and voltage are stored in the forcing function's DAC register. The load line shown in quadrant one indicates a resistive load with a positive voltage bias. This load's stable operating point is shown on the programmed current rail, indicating its effective resistance is lower than that necessary to allow a voltage rail operation.

The power sinking load line shown can be a transient condition caused by a sudden reduction in current demand. This momentary transition into quadrant two might be caused by dumping a bypass capacitor's charge. Quadrants two and four are power sink quadrants while quadrants one and three are power source.

DPS's 18 status signals for operating quadrant, voltage or current rail, and a greater than or less than current limit allow a unique asynchronous power drain monitor. These seven status indicators can be program enabled as alarms to sense out of tolerance bias conditions.

The following statement definitions are the basic set of user visible DPS 18 elemental statements.

Defining the Forcing Function

DEFINE-POWER (DPS-NUMBER: DPS-NUMBER-TYPE; VFORCE-VALUE: VOLTS; VFORCE-RANGE: V-RANGE-TYPE; IFORCE-VALUE: DPS-AMPS; IFORCE-RANGE: I-RANGE-TYPE; POWER-DELAY: DELAY-SECONDS; COMPENSATION: COMPENSATION-TYPE).

This statement loads into a virtual test resource all the range and value information related to the DPS 18 forcing functions. The virtual test resource is included in the RAM of the test head controller 12 and stores data for down loading to the hardware registers included in the DPS 18 upon activation of the DPS. These values are used to define the operating characteristic of the DPS 18. In addition, the user specifies here the amount of time allowed for DPS 18 settling. User defined compensation determines the DPS 18 dynamic response and the maximum capacitive load that can be connected with stable operation. This time value is the amount of time delay which is initiated for any following delay dependent functions. This statement only loads values into the virtual test resource and causes no tester communication.

Defining the Current Limit

DEFINE-DPS-I-LIMIT (DPS-NUMBER: DPS-NUMBER-TYPE; I-LIMIT: DPS-AMPS; DIRECTION: RELATION-TYPE).

Typical DPS 18 application is as DUT voltage bias. With this statement the user can specify a greater than or less than GT/LT current limit within the bounds of the I-FORCE RANGE. The I-LIMIT status bit is set if the DPS 18 operating point is respectively greater than or less than the limit value. This statement only loads values into the virtual test resource and causes no tester communication.

Modifying the Forcing Functions

REDEFINE-POWER (DPS-NUMBER: DPS-NUMBER-TYPE; VFORCE-VALUE: VOLTS; IFORCE-VALUE: AMPS).

After the DPS 18 is gated on, the user can make minor adjustments to the bias conditions using this statement. This allows a simpler parameter list since it is assumed that ranges are not changed. This statement only loads values into the virtual test resource and causes no tester communication.

Defining The Alarm Enables

ENABLE-DPS-ALARMS (DPS-NUMBER: DPS-NUMBER-TYPE; ALARMS: DPS-STATUS-SET).

This statement allows the user to specify which of the possible asynchronous alarm monitors are to be armed. Various of them are likely activated during gate on activities, so they are automatically suppressed until the specified settling time has expired. The history of which status bits were set during DPS 18 settling is preserved by the SET-POWER service and can be displayed via debug facilities. This statement only loads values into the virtual test resource and causes no tester communication.

The ENABLE-DPS-ALARMS elemental defines which DPS 18 status indicators are to be armed as a DC subsystem 16 interrupt referred to as a DPS alarm. Each DPS 18 used in a test plan has a known loci of operating points that are acceptable. For example, a VCC bias source has an expected operating point on the voltage rail in quadrant one as a power source. The I-LIMIT alarm can be set to further restrict acceptable operating points to less than or greater than a specified current value. For this typical case, the user alarm set variable should include Kelvin, I-LIMIT, I-RAIL, QUAD2, QUAD3, and QUAD4 to define the unacceptable operating points that should result in a DC subsystem 16 interrupt. Unless the user has defined a DPS-ALARM-MASK and provides an appropriate DPS-ALARM-HANDLER, the test plan terminates in a fail condition when a DC subsystem 16 interrupt occurs. As the acceptable DPS 18 operating point changes during execution of a test plan, new limiting alarms can be evoked by this elemental. The changes are put into effect by a SET-POWER with a TURN-DPS-ON or ADJUST-DPS option. Continuous monitoring of the DUT power demand throughout the test plan execution is the intended application of the DPS 18 alarms, but a null set of alarms can be loaded to defeat this monitoring once it is evoked. The default virtual test resource condition has all interrupt paths disabled. Thus, this elemental is required to use the DPS 18 monitoring capability. This elemental loads virtual test resource values for the selected DPS-NUMBER. A subsequent SET-POWER enables the alarms included in the set variable.

Establishing Power In The Tester

SET-POWER (POWER-FUNCTION: POWER-FUNCTION-TYPE; POWER-SET: DPS-NUMBER-SET).

This is the primary action statement for DPS 18 usage. It causes all relevant information about a set of DPS's 18 to be transferred to the test head controller 12 and executed as either a power up, power down, or power adjustment activity. It is assumed that all DPS's 18 specified in this statement can be gated on simultaneously. If there are power sequencing requirements for the DUT, a sequence of SET-POWER statements is used including only those which can be gated on simultaneously in any given statement. For that purpose this statement is DPS 18 time delay dependent (waits for any active DPS delay). The time delay generated by this statement is the longest delay required for any DPS 18 in the set being changed. This implies that a sequence of SET-POWER statements can be included in a packet and a properly sequenced activity ensues.

This parameter option can only be used for DPS's 18 that are in a gate off state. The sequence of events initiated is as follows. Parameters of DEFINE-DPS-I-LIMIT and DEFINE-POWER are loaded in to test circuitry. The longest POWER-DELAY of the POWER-SET is loaded to the DPS 18 timer. Each DPS 18 included in the POWER-SET is gated on, and the DPS 18 timer countdown is initiated. If any of the POWER-SET virtual test resources indicated an armed DPS-ALARM, the elemental waits for the DPS timer to countdown and any latched status history is cleared. Then the designated alarms are enabled. If no alarms are enabled, the elemental allows normal test plan continuation without waiting for DPS timer countdown to complete, and subsequent latched status history will indicate the slew path taken to a final operating point.

The ADJUST-DPS option is only allowed when all DPS's 18 included in the POWER-SET are in the gate-on state. The events initiated are as follows. All DPS-ALARMS of the POWER-SET are disabled. Parameters from REDEFINE-POWER are loaded to DPS's 18 included in the POWER-SET and a DPS timer countdown is initiated based upon the slowest COMPENSATION-TYPE and the defined delta change in operating point(s). If the virtual test resources have DPS-ALARMS armed, they are enabled after the DPS timer countdown completes. Otherwise, the test plan is allowed to continue without a wait for the count to complete. When any DPS-ALARM is enabled, all status indicators are momentarily reset to clear the history condition.

The TURN-DPS-OFF option is allowed only when all DPS's 18 included in the POWER-SET are in the gate-on state. The events initiated are as follows. All DPS-ALARMS are disabled. In this case, this includes all alarms for all DPS's 18 in the gate-on state. The intent is to prevent false fail indications during a DUT power down sequence. Historical status remains latched to indicate abnormal excursions of the DPS 18 operating point during the power down sequence.

DPS's 18 included in the POWER-SET are reprogrammed to an uncalibrated zero volts, and a DPS timer count down based upon the slowest COMPENSATION-TYPE is initiated.

When the DPS 18 timer countdown completes, the DPS's included in the POWER-SET are gated-off. To re-enable alarms of the DPS's 18 that are left gated-on for continuation of the test plan, SET-POWER is required.

Determining Cause Of Failure

READ-DPS-STATUS (DPS-NUMBER: DPS-NUMBER-TYPE; DPS-N-STATUS: DPS-STATUS-SET).

This statement returns the DPS 18 alarm status bits. This status indication is for determining the cause of a DPS 18 alarm and is normally used in the user's DPS alarm exception handler.

This elemental returns the latched DPS 18 status history to a user defined variable. Typical use is in a user defined procedure to determine the prevailing DPS 18 status after an adjustment has been made. To clear the latched status history before read back, the user must execute ENABLE-DPS-ALARMS or SET-POWER before READ-DPS-STATUS. The status state immediately following a SET-POWER that causes DPS 18 gate-on includes the history of how the DPS 18 arrived at the final operating point. Therefore, to read a current status state the user adjusts the force conditions or enables the status interrupt after a DPS 18 has been gated on.

Indeterminate status results occur when the DPS 18 operating point is between two status states. For instance, when programmed to zero volts and connected to an open-circuited load, the DPS-STATUS-SET returned can include any one or all four quadrant status indicators. The exact resolution of the status indicators is to be determined in DPS characterization and controlled via diagnostics.

Performing Measurements With The DPS

DPS-MEASURE (MEASURE-SET: DPS-NUMBER-SET; NOGO-SET: DPS-STATUS-SET).

This statement provides for performing specific measurements on DUT power pins, rather than the continuous monitor function performed by the alarm system. As indicated by the parameters, either go/no-go or value return measurements can be made on any or all DPS's 18 at once. If value returns are requested, the voltage, current, and pass/fail decision information is deposited in the global results variables. The pass/fail decision is based on the current value placed in the virtual test resource by the last DEFINE-DPS-I-LIMIT statement for the DPS's 18 included in the set. This statement invokes the go/no-go decision activities and causes datalogging if the logging of DC measurements or DC failures is active.

The DPS 18 provides latched status indicators that can be armed to cause a DC subsystem 16 interrupt. One intent is for a test plan monitoring capability to assure acceptable operation of the DPS 18 as a DUT voltage bias source. The basic principle of DPS 18 operation is that a connected DUT load forces a DPS operating point on a programmed voltage or current rail. Thus, the DUT power demand (object of test) is directly related to the connected DPS 18 operating point. Seven status indicators are used to define the history of where the DPS 18 operating point has been as the DUT power demand dynamically varies during test plan execution. Another indicator, Kelvin, signals a catastrophic open circuit condition that invalidates all other test indications and is cause for immediate test plan termination.

The seven DPS 18 operating point related status indicators are described below with a brief explanation of their typical test plan use. I-LIMIT is a less than or greater than status signal to define a DPS 18 current demand limit has been exceeded. Test plan application of I-LIMIT can be to define a category sort current limit or a catastrophic limit condition that dictates test plan termination. I-RAIL is a signal to indicate DPS 18 operation on the programmed or the implied current rail. This signal in conjunction with a quadrant signal defines which of the two current rails the DPS 18 operating point has been forced to. A current limit window can be defined between the I-RAIL and I-LIMIT values. I-RAIL alarm can indicate either a category limit has been exceeded or a condition for test plan termination was reached. V-RAIL can indicate that a DPS 18 has successfully reached the intended operating rail. Typically, DPS's 18 are used as constant voltage bias sources, but constant current applications are also possible. QUAD 1/2/3/4 indicates the DPS 18 quadrant of operation. QUAD1 indicates +V+I, QUAD2 indicates −V+I, QUAD3 indicates −V−I, and QUAD 4 indicates +V−I. Like signs are for power source conditions, while unlike signs indicate a DPS 18 power sink quadrant.

Some examples of test plan strategy concerning DPS 18 application are given to define the DPS alarms. The first test plan event involving one or more DPS's 18 is DUT power up. After allowing enough time for each DPS 18 to slew to a stable operating point (assuming an acceptable DUT load), selected status alarms are armed for interrupt. An immediate interrupt at this time is usually an indication of incorrect DPS 18 programmed values or a DUT with excessive power demand. Either of these two conditions is cause for test plan termination. Typically, the first DUT power up of a test plan does not include category sort limits as an interrupt armed alarm.

After successful power up, the test plan continues by setting input, output load, and output limit levels in preparation for a status functional test. While forcing a sequence of input test vectors intended to initialize the DUT state for subsequent STATIC-TEST, internal nodes of the DUT can attain a state that causes abnormal power demand and results in one or more DPS 18 alarms. Dependent on the exact alarm status, the test plan strategy can be to adjust the DPS 18 program values to a lesser category sort condition for continuation of test or to define a fail file which signifies this type of DUT fail condition. This type of alarm event is classed as an asynchronous DPS 18 alarm fail with no other DUT test limit in force at the time of alarm.

One or more DPS 18 alarms can occur in conjunction with a STATIC-TEST vector. These alarms can indicate a category sort limit which can be relaxed to continue test with lesser category limits in force or can define a test terminate condition. When both a DPS 18 alarm and a STATIC-TEST fail condition exist simultaneously, the test plan strategy can be to define relaxed DPS 18 program values and repeat the STATIC-TEST sequence, or select a fail file which signifies the DPS 18 alarm, or select a fail file which signifies the dual fail condition or file the DUT in a predefined status function fail bin. The current STATIC-TEST vector can be the cause of the DPS 18 alarm, or if the static test is executing at a rate faster than the DPS 18 operating point can follow, a previous test vector can be the cause of the alarm. Thus, a returned value indication of the DPS 18 voltage and current would not confirm an alarm operating point, and would only be misleading if included in a datalog report. The only non-ambiguous indicator of out of tolerance conditions is the latched DPS 18 status. Similar DPS 18 alarms can occur during high speed functional test with or without a functional fail condition. This type of DPS 18 alarm condition is again an asynchronous out of tolerance event, that is, it is not necessarily related to the test vector being executed at the time the alarm occurs.

DPS 18 alarms can occur during PMU-MEASURE elemental execution. The cause in this case can be incorrect programmed DPS 18 values, DUT malfunctions triggered by the connected precision measurement units 20, or exceeding one or more category sort limit conditions. Test plan strategy again can be to relax DPS 18 programmed values and repeat tests with a relaxed set of category limits and test conditions in force, or terminate the test plan with a redefined bin result.

As is apparent in the above test plan strategy examples, the user requires flexibility to deal with a DPS 18 alarm condition properly. At test plan initialization, the default setting for all DPS 18 alarms is to terminate the test plan before excessive power dissipation destroys the DUT. All DPS 18 status bits from all DPS alarms should be made available for datalog. If only the first alarm indicator found in a systematic search is delivered, there is not enough information to define the exact cause of test plan termination.

The user can define selected DPS 18 status indicators that are interrupt enabled as exceptions to the default terminate state. These would be indicators of a category sort limit or condition of test that can be relaxed to allow test plan continuation for an effective category sort. The user programs a DPS ALARM procedure to handle the exception conditions and properly implement the test plan strategy.

To indicate multiple out of tolerance conditions that can occur simultaneously, an additional global fail flag is necessary, DPS-ALARM for instance. This would be in addition to the global fail that is associated with functional and/or DC measure failures that are not subject to asynchronous occurrence. The purpose of the global fail is to logically differentiate between one type of out of tolerance indication versus another, or deal with the possibility of two simultaneous fail conditions.

DPS 18 alarms that are caused by program error are only important during test plan debug. One or more datalog records can be provided that have all the pertinent information.

In summary, the high current DPS's 18 preferably provide gated, four-quadrant source forcing functions primarily used for DUT voltage bias. The DPS 18 is a programmable high current supply which can force a constant voltage or clamp to a constant current. This load current or voltage can be measured with an ADC and compared against a programmed limit value for a pass/fail condition or read back for a numerical result.

Each DPS 18 is programmed with a signed value of voltage and current to define two calibrated operation rails in the intended operating quadrant. An implied current rail in the opposite operating quadrant is automatically set by the circuitry to assure program control of maximum power that can be delivered to a shorted DUT load. The connected DUT load determines a stable operating point of the DPS 18 on the program defined characteristic. Each DPS 18 can be used as a constant voltage or a constant current forcing function.

The DPS's 18 must be assigned by the user to the DUT; they are not matrixed. Each DPS 18 force and sense line is brought to a DUT accessible connection point at the test head 14. Each DPS 18 is preferably forcing zero volts with current clamp rails set at one percent of full scale in the last programmed range in a gate-off (high impedance idle state). This gating function allows direct connection to the DUT without use of a disconnect relay.

FIG. 5 shows the voltage-current capability of each DPS 18. If the current drawn by the load attempts to exceed the programmed value, the DPS 18 becomes a constant current source at the programmed value. Otherwise, the DPS 18 operates as a constant voltage source. The programmed voltage and current ranges are shown in Table I.

Each DPS 18 is capable of operating in any one of four quadrants (FIG. 5) as follows: ±32 V at ±1 A (four quadrants); 32 V at 2 A or −32 V at −2 A (two quadrants); and 8 V at 8 A or −8 V at −8 A (two quadrants). The preferred voltage and current ranges of each DPS 18 are as follows:

TABLE I

| DPS VOLTAGE SPECIFICATION | | | |
|---|---|---|---|
| | | Resolution | |
| Range | Full Scale (compliance) | Forced 13 bits + sign | Measured 11 bits + sign |
| 1 V | 1.049 V | 128 μV | 512 μV |
| 2 V | 2.097 V | 256 μV | 1.024 mV |
| 4 V | 4.194 V | 512 μV | 2.048 mV |
| 8 V | 8.389 V | 1.024 mV | 4.098 mV |
| 16 V | 16.777 V | 2.048 mV | 8.192 mV |
| 32 V | 33.554 V | 4.096 mV | 16.384 mV |

Accuracy Force/Measure: ± (0.1% value + 2 mV/A + (2.5 mV or 1 count whichever is greater)).

| DPS CURRENT SPECIFECATION | | | |
|---|---|---|---|
| | | Resolution | |
| Range | Full Scale (compliance) | Forced 14 bits + sign | Measured 11 bits + sign |
| 16 mA | 16.384 mA | 1 μA | 8 μA |
| 32 mA | 32.768 mA | 2 μA | 16 μA |
| 64 mA | 65.536 mA | 4 μA | 32 μA |
| 128 mA | 131.072 mA | 8 μA | 64 μA |
| 256 mA | 262.144 mA | 16 μA | 128 μA |
| 512 mA | 524.288 mA | 32 μA | 256 μA |
| 1 A | 1.049 A | 64 μA | 512 μA |
| 2 A | 2.097 A | 128 μA | 1.024 mA |
| 4 A | 4.194 A | 256 μA | 2.048 mA |
| 8 A | 8.389 A | 512 μA | 4.096 mA |

Accuracy Force/Measure: ± (0.1% + 0.1%/A + 1 count). The maximum current that can be programmed from a DC subsystem 16 is + and −16 A; however, a maximum of 16 A can be returned to test head common. These specifications apply to the Kelvin point (FIG. 5).
Other characteristics of each DPS 18 are:
Load Regulation: ±20 mV. No load to full load at sense point with sensing at performance board.
Settling Time: See Table II. Settling time is that required to be within 0.1% of programmed value. Current available for charging capacitance is 200% of the highest value in the programmed current range.

Table II A, B, and C shows the estimated maximum capacitive load for each current range for three settling times to 0.1% of final value.

TABLE II

| ESTIMATED SETTLING TIMES WITH CAPACITIVE LOADING | | | | | | | | | | |
|---|---|---|---|---|---|---|---|---|---|---|
| Current Range | 8A | 4A | 2A | 1A | 512 ma | 256 ma | 128 ma | 64 ma | 32 ma | 16 ma |
| A - Settling Time = 200 μsec | | | | | | | | | | |
| Cl (μf) | 75 | 37 | 18.7 | 9.35 | 4.67 | 2.34 | 1.16 | 0.58 | 0.29 | 0.14 |
| B - Settling Time = 1 millisec | | | | | | | | | | |
| Cl (μf) | 408. | 204. | 102. | 59. | 29.5 | 15. | 7.4 | 3.7 | 1.85 | 0.925 |
| C - Settling Time = 10 millisec | | | | | | | | | | |
| Cl (μf) | 4080 | 2040 | 1020 | 590 | 295. | 150. | 74. | 37. | 18.5 | 9.25 |

The load current of each DPS 18 can be monitored and compared against programmed greater than/less than limits for pass/fail conditions. An on-board ADC can be used to indicate a go/no-go decision based on DUT current demand greater than or less than a programmed limit. The DUT can be biased by multiple DPS's 18 in a typical test case. Each DPS 18 can be program enabled to signal a fail condition based upon an operating point which is: greater than or less than a programmed current limit; on a current or voltage rail; or in a quadrant other than that programmed.

The on-board ADC can be used to obtain a numerical result which defines the operating point of the DPS 18. The ADC can be programmed to return a voltage or current reading. The result can be used for further computations, compared for category sorts, or data logged.

Fail condition signals allow production test of multiple average power drain limits with simultaneous functional test. Plots of average power drain versus frequency of operation are easily attainable for engineering characterization. Consequently, it is possible to diagnose a DUT internal node short and thereafter pinpoint the cause at a slow functional test rate for corrective action.

The method and apparatus of this invention have several advantages over the techniques of the prior art. Although a preferred embodiment of the method and apparatus of this invention has been described above, it will be apparent to those skilled in the art that numerous variations can be made without departing from the spirit and scope of the invention as defined by the appended claims.

What is claimed is:

1. A method for continuously applying and monitoring a test bias signal at a node of a device under test including digitally programmed source means having a preselected programmed voltage-current characteristic defined by not-to-exceed voltage rail and current rail levels for supplying a test bias signal to the node, comparison means connected to the node, and means for latching the output signal produced by the comparison means, the method comprising the steps of:
   connecting the test bias signal to the node;
   continuously comparing the voltage applied to the node with the preselected programmed voltage rail level;
   providing an indication of the relative magnitude of the voltage applied to the node with respect to the voltage rail level;
   setting first latching means when the voltage applied to the node reaches the voltage rail level;
   continuously comparing the current at the node with the preselected programmed current rail level;
   providing an indication of the relative magnitude of the current at the node with respect to the current rail level; and
   setting second latching means when the current at the node reaches the current rail level.

2. The method of claim 1, further comprising the steps of:
   continuously comparing the test bias signal voltage applied to the node with a reference voltage for determining the polarity of the test bias signal voltage;
   continuously comparing the test bias signal current at the node with a reference current for determining the polarity of the test bias signal current;
   setting third latching means when the test bias signal voltage applied to the node is positive and the test bias signal current at the node is positive;
   setting fourth latching means when the test bias signal voltage applied to the node is positive and the test bias signal current at the node is negative;
   setting fifth latching means when the test bias signal voltage applied to the node is negative and the test bias signal current at the node is negative; and
   setting sixth latching means when the test bias signal voltage applied to the node is negative and the test bias signal current at the node is positive.

3. The method of claim 2, further comprising the steps of:
   continuously comparing the test bias signal with the bias level at the node;
   providing an indication of the relative magnitude of the test bias signal with respect to the bias level; and
   setting another latching means when the test bias signal has a predetermined relationship with respect to the bias level.

4. The method of claim 3, further comprising the steps of:
   continuously comparing the bias level voltage at the node with a Kelvin reference voltage;
   providing an indication of the relative magnitude of the bias level voltage at the node with respect to the Kelvin reference voltage; and
   setting an additional latching means when the bias level voltage at the node has a predetermined relationship with respect to the Kelvin reference voltage.

5. The method of claim 1 wherein the test bias signal is a forcing function which starts at zero volts and one percent of the maximum current of a preselected voltage-current range.

6. Apparatus for continuously applying and monitoring a test bias signal to a node of a device under test, comprising:
   digitally programmed source means connected to the node, the digitally programmed source means having a preselected programmed voltage-current characteristic defined by not-to-exceed voltage rail and current rail levels for supplying test bias signals to the node;

first comparison means connected to the node for continuously comparing the voltage applied to the node with the preselected programmed voltage rail level;

first latching means for providing an indication when the voltage applied to the node reaches the voltage rail level;

second comparison means connected to the node for continuously comparing the current at the node with the preselected programmed current rail level; and second latching means for providing an indication when the current at the node reaches the current rail level.

7. Apparatus as in claim 6, further comprising:

third comparison means for continuously comparing the test bias signal voltage applied to the node with a reference voltage for determining the polarity of the test bias signal voltage;

fourth comparison means for continuously comparing the test bias signal current at the node with a reference current for determining the polarity of the test bias signal current;

third latching means for providing an indication when the test bias signal voltage applied to the node is positive and the test bias signal current at the node is negative;

fourth latching means for providing an indication when the test bias signal voltage applied to the node is positive and the test bias signal current at the node is negative;

fifth latching means for providing an indication when the test bias signal voltage applied to the node is negative and the test bias signal current at the node is negative; and sixth latching means for providing an indication when the test bias signal voltage applied to the node is negative and the test bias signal current at the node is positive.

8. Apparatus as in claim 7, further comprising:

fifth comparison means connected to the node for continuously indicating the relative magnitude of the test bias signal with respect to the bias level at the node; and another latching means for providing an indication when the test bias signal has a predetermined relationship with respect to the bias level.

9. Apparatus as in claim 8, further comprising:

sixth comparison means for continuously comparing the bias level voltage at the node with a Kelvin reference voltage; and an additional latching means for providing an indication when the bias level voltage at the node has a predetermined relationship with respect to the Kelvin reference voltage.

10. Apparatus as in claim 9 wherein the digitally programmed source means is a crossover source.

11. Apparatus as in claim 10 wherein the digitally programmed source means supplies a test bias signal in the form of a forcing function that starts at zero volts and one percent of the maximum current of a preselected voltage-current range.

* * * * *